United States Patent
Kim

[11] Patent Number: 6,118,395
[45] Date of Patent: Sep. 12, 2000

[54] OPERATIONAL AMPLIFIER WITH OFFSET COMPENSATION FUNCTION

[75] Inventor: Young Dae Kim, Kyunggi-Do, Rep. of Korea

[73] Assignee: LG Electronics Inc., Seoul, Rep. of Korea

[21] Appl. No.: 09/181,869

[22] Filed: Oct. 29, 1998

[30] Foreign Application Priority Data

Nov. 1, 1997 [KR] Rep. of Korea ...................... 97-57618

[51] Int. Cl.[7] .................................................. H03M 1/66
[52] U.S. Cl. ........................................... 341/135; 330/257
[58] Field of Search .............................. 341/135; 330/257, 330/288

[56] References Cited

U.S. PATENT DOCUMENTS

| | | | |
|---|---|---|---|
| 4,007,427 | 2/1977 | Leidich | 330/20 |
| 4,410,857 | 10/1983 | Olmstead | 330/253 |
| 4,498,001 | 2/1985 | Smoot | 330/288 |
| 4,605,907 | 8/1986 | Rosenthal et al. | 330/257 |
| 4,992,756 | 2/1991 | Anderson | 330/253 |
| 5,182,525 | 1/1993 | Theus | 330/253 |
| 5,245,344 | 9/1993 | Sooch | 341/150 |

*Primary Examiner*—Howard L. Williams

[57] ABSTRACT

An operational amplifier with an offset compensation function and a D/A converter employing the same for eliminating an offset voltage above a certain limit. In the operational amplifier, a current mirror is provided between a high voltage line and first and second nodes, and a current sink is provided between a third node and a low voltage line. A first transistor controls a current amount flowing from the first node to the third node, and a second transistor controls a current amount flowing the second node to the third node. An amplifier is connected between the second node and an output line to amplify a voltage signal of the output line. A mirror controller responds to the voltage signal from the output line to control the second transistor, and a sink controller responds to the voltage signal from the output line to control the current sink.

27 Claims, 5 Drawing Sheets

OPERATIONAL AMPLIFIER WITH OFFSET COMPENSATION FUNCTION

BACKGROUND OF THE INVENTION

1. Field of the Invention

This invention relates to an operational amplifier for buffering and/or amplifying a signal and, more particularly, to an operational amplifier having an offset compensation function. This invention is also directed to a digital-to-analog (D/A) converter for converting digital data to analog signals employing the operational amplifier.

2. Description of the Background Art

Generally, various types of operational amplifiers have been used to buffer signals, to amplify the magnitude of the signals, and to add the signals to each other. Operational amplifiers are used in various electrical circuits including a D/A converter and a liquid crystal panel driving circuit.

In a liquid crystal display (LCD) device, a conventional operational amplifier includes thin film transistors (TFTs), and is connected to an output buffer and a D/A converter of the liquid crystal panel driving circuit. The TFTs are fabricated by polysilicon, which has inferior characteristic compared to silicon. The TFTs fabricated using a polysilicon material, act as a dominance source for increasing an offset voltage in the operational amplifier.

An offset compensation circuit can be provided in the operational amplifier to eliminate the increased offset voltage. A conventional offset compensation circuit provided in the operational amplifier reduces the offset voltage by controlling the current of the operational amplifier. The offset compensation circuit eliminates any offset voltage which is less than a set limit, but does not eliminate an offset voltage which is greater than the set limit. Further, it is difficult to eliminate an offset voltage in the operational amplifier which is formed with a polysilicon material. These problems of the conventional art will be apparent from the following description with reference to FIGS. 1 and 2.

Referring to FIG. 1, a conventional offset compensation circuit is provided with first to third TFTs T1–T3 for responding to a reset signal RET output from a control line 11, and a first capacitor C1 connected between a non-inverting terminal (+) of an operational amplifier A1 and a first node N1. The first to third TFTs T1–T3 are turned on when the reset signal RET remains at a high logic level, thereby allowing an output signal of the operational amplifier A1 to be charged into the first capacitor C1. Since the first TFT T1 is turned on, the first TFT T1 connects the output terminal of the operational amplifier A1 to an inverting terminal (−) of the operational amplifier A1, and provides the output signal of the operational amplifier A1 to the inverting terminal (−) of the amplifier A1 as a feedback output signal. The second TFT T2 charges the feedback output signal, via the first node N1, into the first capacitor C1. Since the third TFT T3 is turned on, the third TFT T3 connects the non-inverting terminal (+) of the operational amplifier A1 to the ground GND. As a result, the first capacitor C1 is coupled between the inverting terminal (−) of the operational amplifier A1 and the ground GND to thereby charge the feedback output signal into the first capacitor C1.

The conventional offset compensation circuit of FIG. 1 further includes an inverter INV1 for inverting the reset signal RET, and a fourth TFT T4 for responding to the inverted reset signal /RET. The fourth TFT T4 connects the first node N1 to the ground GND when the reset signal RET remains at a low logic level, thereby allowing a voltage charged in the first capacitor C1 to be discharged to the non-inverting terminal (+) of the operational amplifier A1.

As described above, the conventional offset compensation circuit for operational amplifiers samples the output signal of the operational amplifier A1 and applies the sampled output signal to an input terminal of the operational amplifier A1 in an inverted shape, thereby reducing the offset voltage. In other words, the conventional offset compensation circuit provides a negative feedback of the output signal of the operational amplifier to the non-inverting terminal of the operational amplifier to reduce the offset voltage.

FIG. 2 shows a circuitry of the operational amplifier A1 of FIG. 1. As shown in FIG. 2, the operational amplifier A1, responding to a negative feedback signal, includes a high voltage line 12, fourth and sixth TFTs T5 and T6 connected in a current mirror type configuration between second and third nodes N2 and N3, a seventh TFT T7 connected between the second node N2 and a fourth node N4, an eighth TFT T8 connected between the third and fourth nodes N3 and N4, and a ninth TFT T9 connected between the fourth node N4 and a low voltage line 13. The high voltage line 12 is connected to a high voltage source VDD, and the low voltage line 13 is connected to a low voltage source VSS. The seventh TFT T7 controls an amount of current flowing from the second node N2 into the fourth node N4 based on an input signal at the inverting terminal (−), thereby producing an amplified signal at the third node N3. The eighth TFT T8 controls an amount of current flowing from the third node N3 into the fourth node N4 based on the feedback output signal from the non-inverting terminal (+), thereby reducing an offset voltage included in the output signal produced at the third node N3. The ninth TFT T9 constantly maintains the amount of current flowing from the fourth node N4 voltage to the low voltage source VSS via the low voltage line 13 by controlling a bias voltage signal produced from a bias line 14.

The operational amplifier A1 further includes a tenth TFT T10 connected between the high voltage line 12 and a fifth node N5, a second capacitor C2 between the third node N3 and the fifth node N5, and an eleventh TFT T11 connected between the fifth node N5 and the low voltage line 13. The tenth TFT T10 controls an amount of current flowing from the high voltage line 12 into the fifth node N5 based on a voltage on the third node N3 to amplify the voltage on the third node N3. The eleventh TFT T11 keeps a channel width corresponding to the bias voltage from the bias line 14 to maintain a constant resistance value.

The conventional operational amplifier as described above generates an offset voltage due to differences between the seventh and eighth TFTs T7 and T8, between the eighth and ninth TFTs T8 and T9, and between the ninth and eleventh TFTs T9 and T11. This offset voltage increases when the ninth TFT T9 has different characteristics from the TFTs T7, T8 and T11, and the increased offset voltage is not reduced below a certain limit although a mirror current is controlled by the feedback output signal. This is caused by the fact that an amount of current passing through the ninth TFT T9 does not change even though the mirror current is controlled. The offset voltage further increases when the TFTs are formed with a polysilicon material rather than silicon. Generally, an operational amplifier formed with silicon TFTs generates an offset voltage of about 10 mV while an operational amplifier formed with polysilicon TFTs generates an offset voltage of several volts. For instance, when a threshold voltage (Vth) difference between the polysilicon TFTs is 2V, the conventional operational amplifier generates a large offset voltage of about 2V. When the difference in the carrier drift degree ($\mu$) of each polysilicon TFT is about 40 cm$^2$/Vsec, the conventional operational amplifier generates a large offset voltage of approximately 1 V.

SUMMARY OF THE INVENTION

Accordingly, it is an object of the present invention to provide an operational amplifier with an offset compensation function that is adapted to eliminate an offset voltage above a certain limit.

Another object of the present invention is to provide an improved D/A converter employing an operational amplifier with an offset voltage compensation function.

In order to achieve these and other objects of the invention according to one aspect of the present invention, an operational amplifier with an offset compensation function according to the present invention, includes a current mirror provided between a high voltage line and first and second nodes; a current sink provided between a third node and a low voltage line; a first transistor, being responsive to an input signal, for controlling a current amount flowing from the first node into the third node; a second transistor for controlling a current amount flowing the second node into the third node; an amplifying unit connected between the second node and an output line to amplify an output signal from the second node; and a mirror control unit, being responsive to a voltage signal output from the output line, for controlling the second transistor.

Furthermore, the present invention is directed to a digital-to-analog converter including a decoding unit including input terminals for receiving at least two bit data and at least three output terminals to selectively output a signal from the at least three output terminals in accordance with a logical value of the data; a first node commonly connected to the at least three output terminals of the decoding unit; a current mirror provided between the first node and a high voltage line and a second node; a current sink provided between a third node and a low voltage line; a first transistor, being responsive to an input signal, for controlling a current amount flowing from the first node into the third node; a second transistor for controlling a current amount flowing the second node into the third node; an amplifying unit connected between the second node and an output line to amplify an output signal on the second node; and a mirror control unit, being responsive to a voltage signal on the output line, for controlling the second transistor.

Further scope of applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

BRIEF DESCRIPTION OF THE DRAWINGS

These and other objects of the invention will be apparent from the following detailed description of the embodiments of the present invention with reference to the accompanying drawings, in which.

DETAILED DESCRIPTION OF THE PREFERRED EMBODIMENTS

Figure 1:
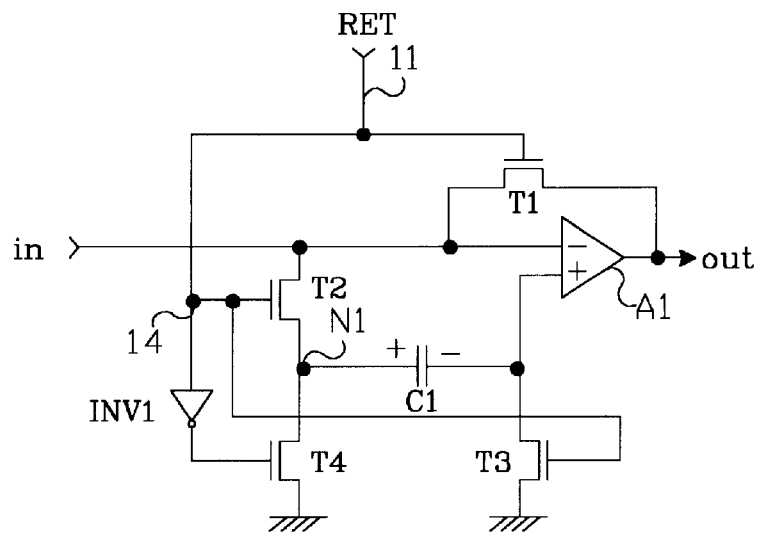
FIG. 1 is a schematic view showing a circuit diagram of a conventional voltage offset compensation circuit.
Figure 2:
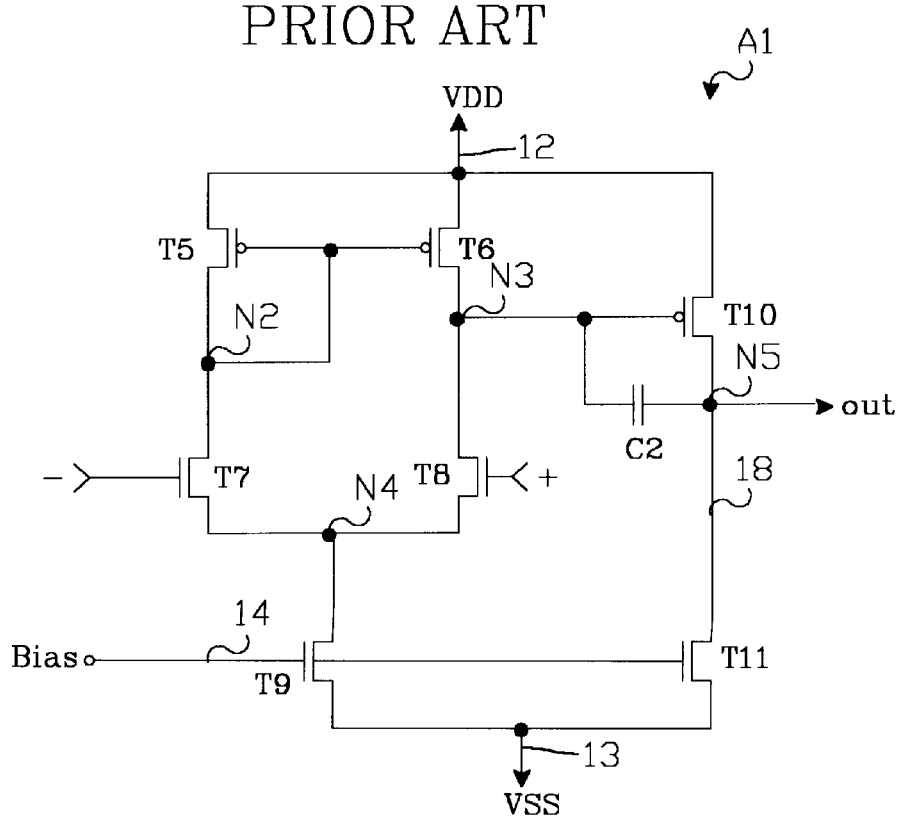
FIG. 2 is a detailed circuit diagram of an operational amplifier of the compensation circuit shown in FIG. 1.
Figure 3:
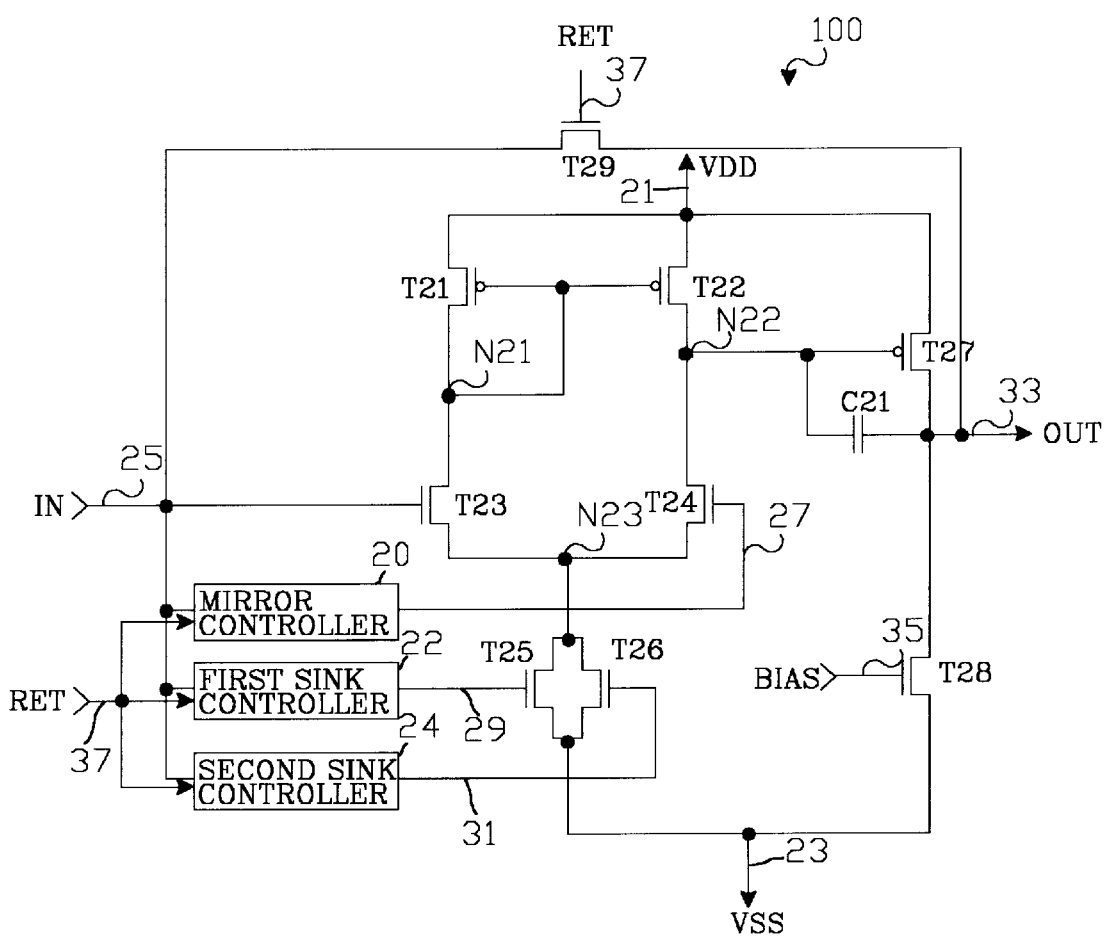
FIG. 3 is a schematic view showing a configuration of an operational amplifier having a offset voltage compensation function according to an embodiment of the present invention.

Referring to FIG. 3, there is shown an operational amplifier 100 with an offset voltage compensation function according to an embodiment of the present invention. As shown therein, the operational amplifier 100 includes a high voltage (VDD) line 21, first and second TFTs T21 and T22 connected in a mirror shape between first and second nodes N21 and N22, a third TFT T23 connected between the first node N21 and a third node N23, a fourth TFT T24 connected between the second node N22 and the third node N23, and fifth and sixth TFTs T25 and T26 connected in parallel between the third node N23 and a low voltage (VSS) line 23. The third TFT T23 controls an amount of current flowing from the first node N21 into the third node N23 based on a voltage signal input from a first input line 25, thereby outputting an amplified signal at the second node N22. The fourth TFT T24 controls an amount of current flowing from the second node N22 into the third node N23 based on a voltage signal input from a second input line 27, thereby reducing an offset voltage included in the output signal on the third node N23. Usually, the first input line 25 is used as an inverting terminal while the second input line 27 is used as a non-inverting terminal. In the alternative, the first input line 25 is used as a non-inverting terminal while the second input line 27 is used as an inverting terminal. The fifth TFT T25 or the sixth TFT T26 controls an amount of current flowing from the third node N23 into the low voltage line 23.

More specifically, the fifth TFT T25 controls the amount of current flowing from the third node N23 into the low voltage line 23 depending upon a voltage signal input from a first control line 29, whereas the sixth TFT T26 controls the same current depending upon a voltage signal input from a second control line 31. Here, an NPN type TFT is used as the fifth TFT T25, and a PNP type TFT is used as the sixth TFT T26. But other TFT types may be used for the fifth and sixth TFTs T25 and T26.

The operational amplifier 100 of the present invention also includes a seventh TFT T27 connected between the high voltage line 21 and the output line 33, a first capacitor C21 connected between the second node N22 and the output line 33, and an eighth TFT T28 connected between the output line 33 and the low voltage line 23. The seventh TFT T27 controls an amount of current flowing from the high voltage line 21 into the output line 33 based on a voltage signal input from the second node N22 to amplify a node voltage at the second node N22. The eighth TFT T28 keeps a channel width corresponding to a bias voltage input from a bias line (or third control line) 37 to maintain a constant resistance value.

The operational amplifier 100 of the present invention further includes a ninth TFT T29 for responding to a reset signal RET from the third control line 37, a mirror controller 20, and first and second sink controllers 22 and 24. The ninth TFT T29 is turned on during an interval at which the reset signal RET remains at a high logic level. At this time, since the output line 33 is connected to the first input line 25 via the ninth TFT T29, an output signal from the output line 33 is fed back from the first input line 25. The mirror controller 20 samples the output signal fed back from the ninth TFT T29 and the first input line 25 during an interval at which the reset signal RET remains at a high logic level, and controls the fourth TFT T24 in accordance with the sampled voltage signal during an interval at which the reset signal RET remains at a low logic level. Under control of the mirror controller 20, the fourth TFT T24 controls an amount of current flowing from the second node N22 into the third node N23. Likewise, the first sink controller 22 samples the output signal fed back by the ninth TFT T29 and the first input line 25 during an interval at which the reset signal RET remains at a high logic level, and controls the fifth TFT T25 in accordance with the sampled voltage signal during an interval when the reset signal RET remains at a low logic level.

Under control of the first sink controller 22, the fifth TFT T25 controls an amount of current flowing from the third node N23 into the low voltage line 23. In a similar manner to the first sink controller 22, the second sink controller 24 samples the output signal fed back via the ninth TFT T29 and the first input line 25 during an interval at which the reset signal RET remains at a high logic level, and controls the sixth TFT T26 in accordance with the sampled voltage signal during an interval when the reset signal RET remains at a low logic level.

Under control of the second sink controller 24, the sixth TFT T26 controls an amount of current flowing from the third node N23 into the low voltage line 23. Since the fifth TFT T25 is connected in parallel to the sixth TFT T26, a sink current, i.e., the current flowing from the third node N23 into the low voltage line 23, increases substantially. This increase in the sink current results in a substantially reduced offset voltage. Accordingly, even though the first to eighth TFTs T21–25 T28 are made from polysilicon, almost no offset voltage appears at the output line 33.

Figure 4A:
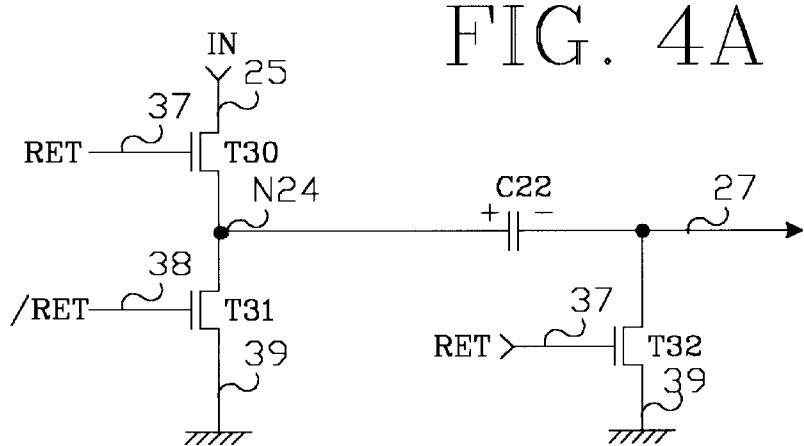
FIG. 4A is a detailed circuit diagram of the mirror controller shown in FIG. 3.
Figure 5:
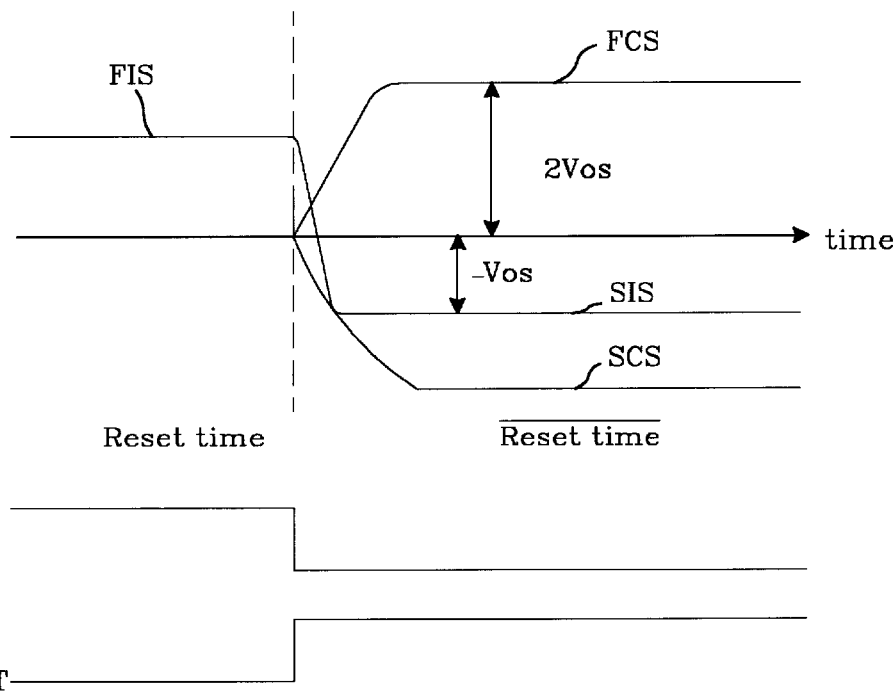
FIG. 5 is an output waveform diagram of the controllers shown in FIGS. 4A–4C.

FIG. 4A is a detailed circuit diagram of the mirror controller 20 in FIG. 3. As shown in FIG. 4A, the mirror controller 20 includes a tenth TFT T30 connected between the first input line 25 and a fourth node N24, an eleventh TFT T31 connected between the fourth node N24 and a ground voltage line 39, a second capacitor C22 connected between the fourth node N24 and the second input line 27, and a twelfth TFT T32 connected between the second input line 27 and the ground voltage line 39. The tenth and twelfth TFTs T30 and T32 are turned on during an interval when the reset signal RET from the third control line 37 remains at a high logic level, thereby connecting the second capacitor C22 between the first input line 25 and the ground voltage line 39. At this time, the second capacitor C22 charges a feedback output signal FIS as shown in FIG. 5 from the first input line 25.

On the other hand, the eleventh TFT T31 is turned on during an interval when the inverted reset signal /RET from the fourth control line 38 remains at a high logic level, thereby allowing the second capacitor C22 to be connected between the second input line 27 and the ground voltage line 39. At this time, the second capacitor C22 changes the polarity of the charged feedback output signal FIS into an opposite polarity and generates a voltage signal SIS as shown in FIG. 5. The second capacitor C22 allows the voltage signal SIS to be applied, via the second input line 27, to the fourth TFT T24. The fourth TFT T24 controls a current amount flowing from the second node N22 into the third node N23 with the feedback output signal SIS applied from the second capacitor C22. Accordingly, a small offset voltage below a certain limit generated at the output line 33 is eliminated.

Figure 4B:
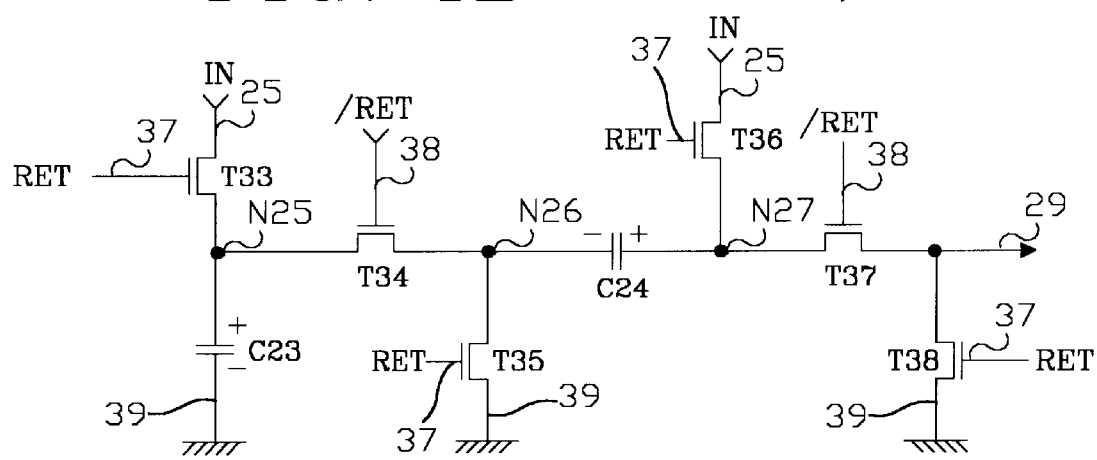
FIG. 4B is a detailed circuit diagram of the first sink controller shown in FIG. 3.

FIG. 4B is a detailed circuit diagram of the first sink controller 22 in FIG. 3. As shown in FIG. 4B, the first sink controller 22 includes a thirteenth TFT T33 connected between the first input line 25 and the fifth node N25, a third capacitor C23 connected between the ground voltage line 29 and the fifth node N25, and a fourteenth TFT T34 connected between the fifth node N25 and a sixth node N26. The thirteenth TFT T33 is turned on during an interval when the reset signal RET from the third control line 37 remains at a high logic level, thereby allowing the third capacitor C23 to be connected between the first input line 25 and the ground voltage line 39. At this time, the third capacitor C23 charges a feedback output signal FIS from the first input line 25. On the other hand, the fourteenth TFT T34 is turned on during an interval when the inverted reset signal /RET from the fourth control line 38 remains at a high logic level, thereby allowing the third capacitor C23 to be coupled between the sixth node N26 and the ground voltage line 39. At this time, the third capacitor C23 allows the charged feedback output signal FIS to be applied to the sixth node N26.

Moreover, the first sink controller 22 includes a fifteenth TFT T35 connected between the sixth node N26 and the ground voltage line 39, a sixteenth TFT T36 connected between the first input line 25 and a seventh node N27, a fourth capacitor C24 connected between the sixth node N26 and the seventh node N27, a seventeenth TFT T37 connected between the seventh node N27 and the first control line 29, and an eighteenth TFT T38 connected between the first control line 29 and the ground voltage line 39. The fifteenth and sixteenth TFTs T35 and T36 are turned on during an interval when the reset signal RET from the third control line 37 remains at a high logic level, thereby allowing the fourth capacitor C24 to be coupled between the first input line 25 and the ground voltage line 39. At this time, the fourth capacitor C24 charges the feedback output signal FIS from the first input line 25. On the other hand, the seventeenth TFT T37 is turned on during an integral when the inverted reset signal /RET remains at a high logic level, thereby allowing the fourth capacitor C24 to be connected between the sixth node N26 and the first control line 29. In this case, since the fourth capacitor C24 is connected in series with the third capacitor C23 between the first control line 29 and the ground voltage line 39, a voltage signal FCS as shown in FIG. 5 corresponding to twice of the feedback output signal is applied to the fifth TFT T25. The fifth TFT T25 controls a current amount flowing from the third node N23 onto the low voltage line 23 by the voltage signal FCS from the third and fourth capacitors C23 and C24. Accordingly, a large offset voltage above the certain limit generated at the output line 33 is eliminated. Subsequently, the eighteenth TFT T38 is turned on during an interval when the reset signal RET from the third control line 37 remains at a high logic level to bypass a remaining voltage signal on the first control line 29 to the ground voltage line 39.

Figure 4C:
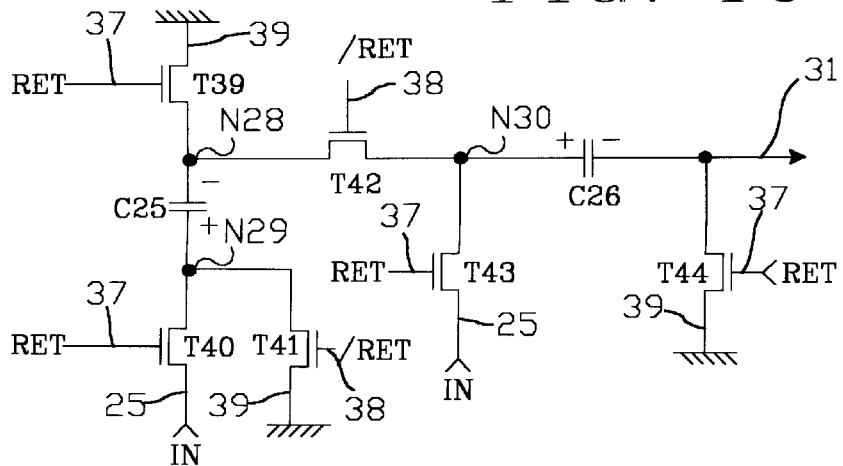
FIG. 4C is a detailed circuit diagram of the second sink controller shown in FIG. 3.

FIG. 4C is a detailed circuit diagram of the second sink controller 24 in FIG. 3. As shown in FIG. 4C, the second sink controller 24 includes a nineteenth TFT T39 connected between the ground voltage line 39 and an eighth node N28, a fifth capacitor C25 connected between the eighth node N28 and a ninth node N29, and a twentieth TFT T40 connected between the ninth node N29 and the first input line 25. The nineteenth and twentieth TFT T39 and T40 are turned on during an interval when the reset signal RET from the third control line 37 remains at a high logic level, thereby allowing the fifth capacitor C25 to be connected between the first input line 25 and the ground voltage line 39. At this time, the fifth capacitor C25 charges a feedback output signal FIS, as shown in FIG. 5, from the first input line 25.

The second sink controller 24 also includes a twenty-first ($21^{st}$) TFT T41 connected between the ninth node N29 and the ground voltage line 39, and a twenty-second ($22^{nd}$) TFT T42 connected between the eighth node N28 and a tenth node N30. The $21^{st}$ and $22^{nd}$ TFTs T41 and T42 are turned on during an interval when the inverted reset signal /RET from the fourth control line 38 remains at a high logic level, thereby allowing the fifth capacitor C25 to be coupled between the ground voltage line 39 and the tenth node N30. At this time, the fifth capacitor C25 is connected in series between the ground voltage line 39 and the second control line 31 along with a sixth capacitor C26, thereby allowing all voltage signals charged therein to have a polarity opposite to the polarity of the feedback output signal. Accordingly, a voltage signal SCS having a different polarity then that of the feedback output signal and a potential difference twice larger than the feedback output signal is applied to the sixth TFT T26 connected to the second control line 31. The sixth TFT T26 controls a current amount flowing from the third node N23 onto the low voltage line 23 in accordance with the voltage signal SCS on the second control line 31.

The second sink controller 24 further includes a twenty-third $23^{rd}$) TFT T43 connected between the first input line 25 and the tenth node N30, and a twenty-fourth ($24^{th}$) TFT T44 connected between the second control line 31 and the ground voltage line 39. The $23^{rd}$ and $24^{th}$ TFTs T43 and T44 allow the sixth capacitor C26 to be coupled between the first input line 25 and the ground voltage line 39 during an interval when the reset signal RET from the third control line 37 remains at a high logic level. At this time, the sixth capacitor C26 charges the feedback output signal FIS inputted, via the tenth node N30, from the first input line 25. The sixth capacitor C26 is connected in series between the second control line 31 and the ground voltage line 39 along with the fifth capacitor C25 during an interval when the reset signal RET remains at a low logic level, i.e., during an interval when the inverted reset signal /RET remains at a high logic level.

Figure 6:
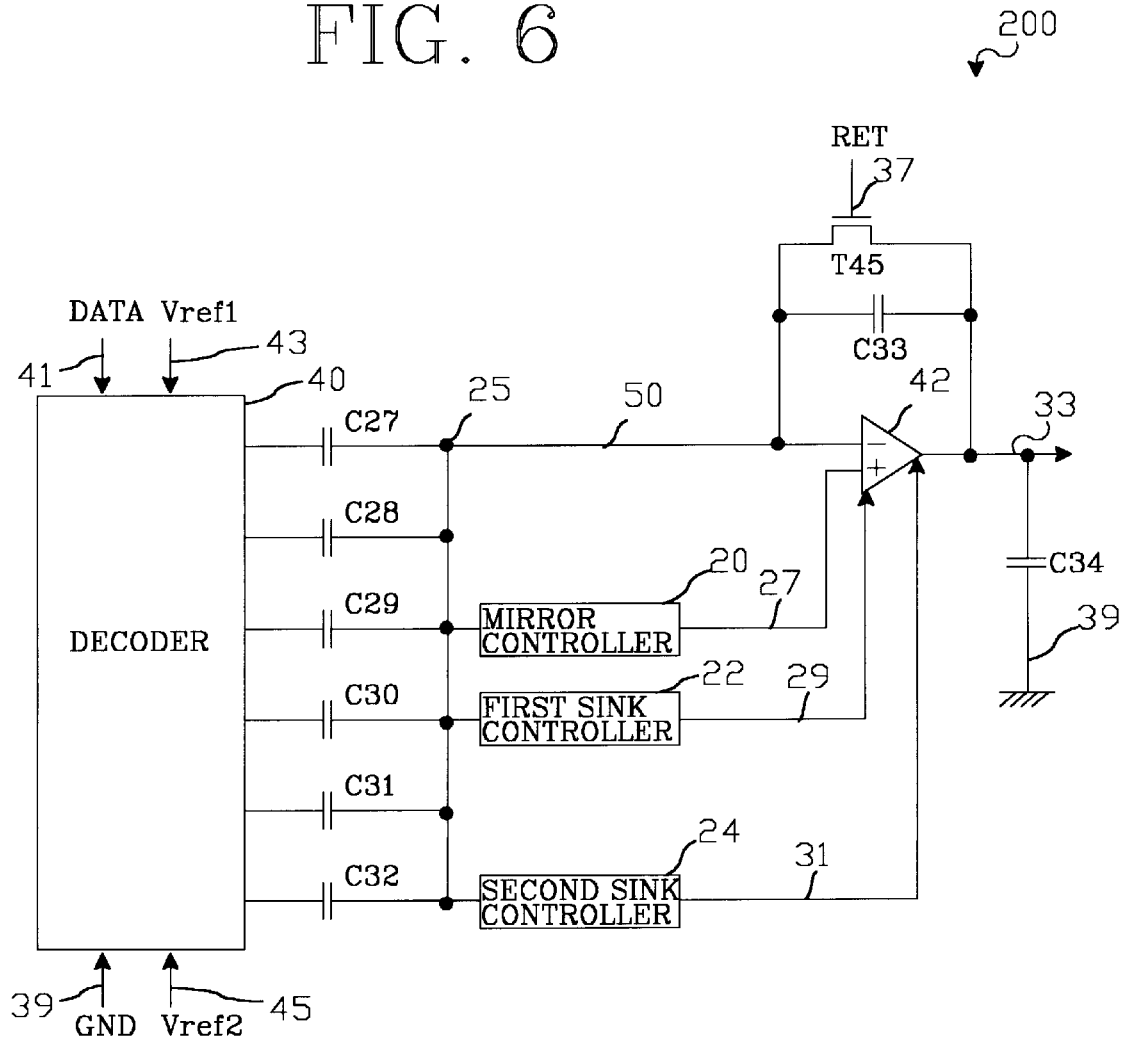
FIG. 6 is a schematic view showing a configuration of a D/A converter according to an embodiment of the present invention.

Referring now to FIG. 6, there is shown a D/A converter 200 according to an embodiment of the present invention. The D/A converter 200 includes a decoder 40, and seventh to twelfth capacitors C27–C32 connected in parallel between the decoder 40 and an inverting terminal (−) 50 of a differential amplifier 42. A six bit data is inputted, via a bus line 41, to the decoder 40 and, at the same time, first and second reference voltage signals Vref1 and Vref2 are inputted, via first and second reference voltage lines 43 and 45, to the decoder 40. The decoder 40 is connected, via the ground voltage line 39, to a ground GND. The decoder 40 applies any one of the ground voltage GND and the first and second reference voltage signals Vref1 and Vref2 to each of the seventh to twelfth capacitor C27–C32 in accordance with a logical value of the six bit data.

More specifically, the decoder 40 applies the ground voltage GND or the second reference voltage signal Vref2 to each of tile seventh to ninth capacitors C27–C29 in accordance with a logical value of the high-order 3 bits of the six bit data. On the other hand, the decoder 40 applies the ground voltage GND or the first reference voltage signal Vref1 to each of the tenth to twelfth capacitors C30–C32 in accordance with a logical value of the low-order 3 bits of the six bit data. "0" to "63" gray levels of voltage signals are selectively applied to the inverting terminal (−) 50 of the differential amplifier 42 by switching between the voltage signals GND, Vref1 and Vref2 in accordance with a logical value of the six bit data as described above. The seventh to twelfth capacitors C27–C32 perform a coupling function to prevent transfer of a direct current component to the inverting terminal (−) 50 of the differential amplifier 42.

The differential amplifier 42 includes the first to eighth TFTs T21–T28 and the first capacitor C21 as shown in FIG. 3. Since the first to eighth TFTs T21–T28 and the first capacitor C21 are identical to those in FIG. 3, explanations thereof will be omitted. A ninth TFT T45 and a thirteenth capacitor C33 are connected between the inverting terminal 50 of the differential amplifier 42 and the output line 33. At the same time, the mirror controller 20 of FIG. 4A and the first and second sink controllers 22 and 24 of FIGS. 4B and 4C are commonly connected to the inverting terminal 50 of the differential amplifier 42. The ninth TFT T45 is turned on during an interval when the reset signal RET from the third control line 37 remains at a high logic level, thereby connecting the output line 33 to the inverting terminal 50. At this time, an output signal on the output line 33 is fed back to the inverting terminal 50. The thirteenth capacitor C33 eliminates a high frequency component of pop noise generated as the ninth TFT T45 is turned on or off. The fourteenth capacitor C34 connected between the output line 33 and the ground voltage line 39 bypasses a high frequency component of the noise signal included in the output signal produced at the output line 33. As the ninth TFT T45 is switched in accordance with the reset signal RET, the differential amplifier 42 amplifies a voltage signal on the inverting terminal 50 only when the reset signal RET remains at a low logic level and outputs the amplified voltage signal through the output line 33.

Meanwhile, the mirror controller 20 and the first and second sink controllers 22 and 24 are responsive to the reset signal RET from the third control line 37 (as shown in FIGS. 4A–4C) to sample the voltage signal at the inverting terminal 50, i.e., the feedback output signal FIS, and control the sampled voltage signal. Each of the mirror controller 20 and the first and second sink controllers 22 and 24 applies the controlled voltage signal to the differential amplifier 42 to prevent generation of an offset voltage on the output line 33.

More specifically, the mirror controller 20 samples the feedback output signal output from the inverting terminal 50 during an interval when the reset signal RET remains at a high logic level. On the other hand, the mirror controller 20 changes the sampled feedback output signal FIS into an opposite polarity voltage signal SIS and, simultaneously, supplies the voltage signal SIS to the non-inverting terminal (+) of the differential amplifier 42 during an interval when the reset signal RET remains at a low logic level. The differential amplifier 42 controls the mirror current by the output signal of the mirror controller 20, thereby eliminating an offset voltage below a certain limit. The first sink controller 22 also samples the feedback output signal FIS on the inverting terminal 50 during an interval when the reset signal RET remains at a high logic level. The first sink controller 22 changes the sampled feedback output signal FIS into a voltage signal FCS having twice the potential difference compared thereto and, simultaneously, supplies the changed voltage signal FCS to the differential amplifier 42 via the first control line 29.

Likewise, the second sink controller 24 samples the feedback output signal FIS output from the inverting terminal 50 during an interval when the reset signal RET remains at a high logic level. The second sink controller 24 changes the sampled feedback output signal FIS into a voltage signal SCS having twice the potential difference of the signal FIS with the opposite polarity and, simultaneously, supplies the changed voltage signal SCS, via the second control line 31, to the differential amplifier 42 during an interval when the reset signal RET remains at a low logic level. The differential amplifier 42 controls the sink current using the output signals of the first and second sink controller 22 and 24, thereby eliminating an offset voltage above the certain limit. Accordingly, even though the differential amplifier 42 is composed of polysilicon TFTs, a voltage signal output from the output line 33 of the differential amplifier 42 includes no offset voltage. As a result, sixty-four (64) gray levels of voltage signals standing between a high level voltage VCC and a low level voltage VSS selectively emerge at the output line 33 of the differential amplifier 42 in accordance with a logical value of six bit data without offset voltages.

Figure 7:
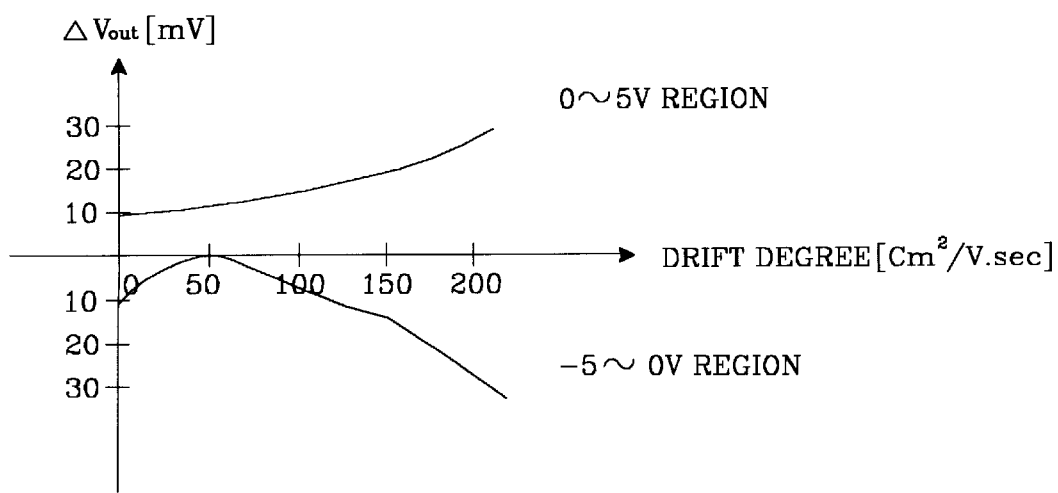
FIG. 7 illustrates a graph showing a relationship between an offset voltage and a drift degree difference between TFTs of the operational amplifier according to the embodiment of the present invention.

FIG. 7 represents a drift degree of majority carriers in the TFTs of the operational amplifier and a variation amount appearing at each output line of the operational amplifier shown in FIG. 3 and the differential amplifier in FIG. 6 when the threshold voltages of the TFTs included in the operational amplifier and the differential amplifier change until ±2V. As seen from FIG. 7, variation amounts $\ddot{A}Vout$ in the output voltage of the operational amplifier and the differential amplifier are below 35 mV when the drift degree in the TFTs is below 200 $Cm^2/V.sec$; whereas, $\ddot{A}Vout$ is below 20 mV when the drift degree in the TFTs is less than approximately 140 $Cm^2/V.sec$. Accordingly, the D/A converter 200 employing the operational amplifier with an offset compensation function according to the present invention can accurately process six bit data by utilizing a low level voltage signal and a high level voltage that have an approximately 5V potential difference between them. In this case, a voltage difference between the 64 gray levels becomes 78 mV.

As described above, the operational amplifier with an offset compensation function according to the present invention controls both the mirror current and the sink current by controlling the output signal, thereby eliminating a large offset voltage above a certain limit. Accordingly, the operational amplifier with an offset compensation function according to the present invention can be implemented using TFTs made with polysilicon.

Furthermore, the D/A converter according to the present invention employing the above described operational amplifier generates hardly no offset voltages in the operational amplifier, so that it converts digital data into analog signals by utilizing a relatively small voltage level difference. Moreover, the D/A converter can be made with polysilicon.

Although the present invention has been explained by the embodiments shown in the drawings described above, it should be understood to the ordinary skilled person in the art that the invention is not limited to the embodiments, but rather that various changes or modifications thereof are possible without departing from the spirit of the invention. Accordingly, the scope of the invention shall be determined only by the appended claims and their equivalents.

What is claimed is:

1. An operational amplifier with an offset compensation function, comprising:
   a current mirror provided between a high voltage line and first and second nodes;
   a current sink provided between a third node and a low voltage line;
   a first transistor, being responsive to an input signal, for controlling a current amount flowing from the first node into the third node;
   a second transistor for controlling a current amount flowing the second node into the third node;
   an amplifying unit connected between the second node and an output line to amplify an output signal from the second node; and
   a mirror control unit, being responsive to a voltage signal output from the output line, for controlling the second transistor.

2. The operational amplifier as claimed in claim 1, further comprising:
   a sink control unit, being responsive to the voltage signal output from the output line, for controlling the current sink.

3. The operational amplifier as claimed in claim 2, wherein the current sink includes third and fourth transistors connected in parallel between the third node and the low level line to respond to an output signal of the sink control unit.

4. The operational amplifier as claimed in claim 3, wherein the third transistor is an NPN type thin film transistor and the fourth transistor is a PNP type thin film transistor.

5. The operational amplifier as claimed in claim 3, wherein the sink control unit includes:
   a first voltage sampler for sampling the voltage signal output from the output line and applying the sampled voltage signal to the third transistor; and
   a second voltage sampler for sampling the voltage signal of the output line and applying the sampled voltage signal to the fourth transistor.

6. The operational amplifier as claimed in claim 5, wherein the first voltage sampler applies the sampled voltage signal, which has an increased voltage level than the voltage signal output from the output line, to the third transistor.

7. The operational amplifier as claimed in claim 5, wherein the first voltage sampler includes at least two capacitors connected in parallel to the output line and in series to the third transistor.

8. The operational amplifier as claimed in claim 5, wherein the second voltage sampler applies the sampled voltage signal to the fourth transistor, said sampled voltage signal having an increased voltage level and an opposite polarity compared to the voltage signal output from the output line.

9. The operational amplifier as claimed in claim 8, wherein the first voltage sampler includes at least two capacitors connected in parallel to the output line in a forward direction and in series to the fourth transistor in a reverse direction.

10. The operational amplifier as claimed in claim 1, wherein the sink control unit includes a voltage sampler for sampling the voltage signal from the output line, and applying the sampled voltage signal to the current sink.

11. The operational amplifier as claimed in claim 10, wherein the sampled voltage signal has an increased voltage level than the voltage signal output from the output line.

12. The operational amplifier as claimed in claim 1, wherein the mirror control unit includes a voltage sampler for sampling the voltage signal output from the output line and applying the sampled voltage signal to the second transistor.

13. The operational amplifier as claimed in claim 12, wherein the voltage sampler applies the sampled voltage signal to the second transistor, the sampled voltage signal having a polarity opposite to the voltage signal output from the output line.

14. A digital-to-analog converter, comprising:
   a decoding unit including input terminals for receiving at least two bit data and at least three output terminals to selectively output a signal from the at least three output terminals in accordance with a logical value of the data;
   a first node commonly connected to the at least three output terminals of the decoding unit;
   a current mirror provided between the first node and a high voltage line and a second node;
   a current sink provided between a third node and a low voltage line;
   a first transistor, being responsive to an input signal, for controlling a current amount flowing from the first node into the third node;
   a second transistor for controlling a current amount flowing the second node into the third node;
   an amplifying unit connected between the second node and an output line to amplify an output signal on the second node; and
   a mirror control unit, being responsive to a voltage signal on the output line, for controlling the second transistor.

15. The digital-to-analog converter as claimed in claim 14, further comprising:
   at least three coupling capacitors between the at least three output terminal of the decoding unit and the first node, respectively.

16. The digital-to-analog converter as claimed in claim 14, wherein the mirror control unit includes a voltage sampler for sampling the voltage signal of the output line and applying the sampled voltage signal to the second transistor.

17. The digital-to-analog converter as claimed in claim 16, wherein the voltage sampler supplies the sampled voltage signal to the second transistor, the sampled voltage signal having a polarity opposite to the voltage signal of the output line.

18. The digital-to-analog converter as claimed in claim 14, further comprising:
   a sink control unit, being responsive to the voltage signal on the output line, for controlling the current sink.

19. The digital-to-analog converter as claimed in claim 18, wherein the sink control unit includes a voltage sampler for sampling the voltage signal of the output line and applying the sampled voltage signal to the current sink.

20. The digital-to-analog converter as clamed in claim 19, wherein said sampled voltage signal has an increase voltage level compared to the voltage signal of the output line.

21. The digital-to-analog converter as claimed in claim 18, wherein the current sink includes third and fourth transistors connected in parallel between the third node and the low voltage line to respond to an output signal of the sink control unit.

22. The digital-to-analog converter as claimed in claim 21, wherein the third transistor is an NPN type thin film transistor, and the fourth transistor is a PNP type thin film transistor.

23. The digital-to-analog converter as claimed in claim 21, wherein the sink control unit includes:
   a first voltage sampler for sampling the voltage signal of the output line, and applying the sampled voltage signal to the third transistor; and
   a second voltage sampler for sampling the voltage signal of the output line, and applying the sampled voltage signal to the fourth transistor.

24. The digital-to-analog converter as claimed in claim 23, wherein the first voltage sampler applies the sampled voltage signal to the third transistor, said sampled voltage signal having a higher voltage level than the voltage signal of the output line.

25. The digital-to-analog converter as claimed in claim 23, wherein the first voltage sampler includes at least two capacitors connected in parallel to the output line and in series to the third transistor.

26. The digital-to-analog converter as claimed in claim 23, wherein the second voltage sampler applies the sampled voltage signal to the fourth transistor, said sampled voltage signal having a higher voltage level and an opposite polarity compared to the voltage signal of the output line.

27. The digital-to-analog converter as claimed in claim 26, wherein the first voltage sampler includes at least two capacitors connected in parallel to the output line in a forward direction and in series to the fourth transistor in a reverse direction.

* * * * *